United States Patent
Klun et al.

(10) Patent No.: US 10,804,419 B2
(45) Date of Patent: *Oct. 13, 2020

(54) PHOTOVOLTAIC DEVICES WITH ENCAPSULATING BARRIER FILM

(71) Applicant: 3M INNOVATIVE PROPERTIES COMPANY, St. Paul, MN (US)

(72) Inventors: Thomas P. Klun, Lakeland, MN (US); Alan K. Nachtigal, Minneapolis, MN (US); Joseph C. Spagnola, Woodbury, MN (US); Mark A. Roehrig, Stillwater, MN (US); Jennifer K. Schnobrich, St. Paul, MN (US); Guy D. Joly, Shoreview, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 88 days.

This patent is subject to a terminal disclaimer.

(21) Appl. No.: 15/871,508

(22) Filed: Jan. 15, 2018

(65) Prior Publication Data

US 2018/0138339 A1 May 17, 2018

Related U.S. Application Data

(63) Continuation of application No. 14/419,534, filed as application No. PCT/US2013/028499 on Mar. 1, 2013, now abandoned.

(Continued)

(51) Int. Cl.
*H01L 31/048* (2014.01)
*B32B 27/08* (2006.01)
(Continued)

(52) U.S. Cl.
CPC .......... *H01L 31/0481* (2013.01); *B32B 27/08* (2013.01); *B32B 27/16* (2013.01);
(Continued)

(58) Field of Classification Search
CPC . B32B 2307/7242; B32B 27/08; B32B 27/16; C09D 133/14; H01L 31/0481; Y02E 10/50
See application file for complete search history.

(56) References Cited

U.S. PATENT DOCUMENTS 3,600,216 A 8/1971 Stewart
3,748,300 A * 7/1973 Lalancette .......... C04B 20/1029
523/466
(Continued)

FOREIGN PATENT DOCUMENTS

CN 1154087 A 7/1997
CN 1771127 A 5/2006
(Continued)

OTHER PUBLICATIONS

Affinito, "Polymer-Oxide Transparent Barrier Layers", Society of Vacuum Coaters 39th Annual Technical Conference Proceedings, 1996, pp. 392-397.
(Continued)

*Primary Examiner* — Michael B Nelson
(74) *Attorney, Agent, or Firm* — James A. Baker

(57) ABSTRACT

Encapsulated device including a photovoltaic cell and a composite film overlaying at least a portion of the photovoltaic cell, the composite film further including a substrate, a base (co)polymer layer on a major surface of the substrate, an oxide layer on the base (co)polymer layer, and a protective (co)polymer layer derived from a silane precursor compound on the oxide layer.

9 Claims, 1 Drawing Sheet

Related U.S. Application Data

(60) Provisional application No. 61/681,051, filed on Aug. 8, 2012.

(51) Int. Cl.
*B32B 27/16* (2006.01)
*C09D 133/14* (2006.01)

(52) U.S. Cl.
CPC .... *C09D 133/14* (2013.01); *B32B 2307/7242* (2013.01); *Y02E 10/50* (2013.01)

(56) References Cited

U.S. PATENT DOCUMENTS

| | | | |
|---|---|---|---|
| 4,378,250 | A | 3/1983 | Treadway |
| 4,650,889 | A | 3/1987 | Plueddemann |
| 4,696,719 | A | 9/1987 | Bischoff |
| 4,722,515 | A | 2/1988 | Ham |
| 4,842,893 | A | 6/1989 | Yializis |
| 4,889,768 | A | 12/1989 | Yokoshima |
| 4,954,371 | A | 9/1990 | Yializis |
| 4,983,737 | A | 1/1991 | Ravichandran |
| 5,018,048 | A | 5/1991 | Shaw |
| 5,032,461 | A | 7/1991 | Shaw |
| 5,097,800 | A | 3/1992 | Shaw |
| 5,125,138 | A | 6/1992 | Shaw |
| 5,142,012 | A | 8/1992 | Furukawa |
| 5,233,006 | A | 8/1993 | Wolter |
| 5,384,342 | A | 1/1995 | Szum |
| 5,399,738 | A | 3/1995 | Wolter |
| 5,440,446 | A | 8/1995 | Shaw |
| 5,442,071 | A | 8/1995 | Galbo |
| 5,532,398 | A | 7/1996 | Wolter |
| 5,547,908 | A | 8/1996 | Furuzawa |
| 5,654,084 | A | 8/1997 | Egert |
| 5,696,179 | A | 12/1997 | Chawla |
| 5,770,301 | A | 6/1998 | Murai |
| 5,866,651 | A | 2/1999 | Moren |
| 5,877,895 | A | 3/1999 | Shaw |
| 5,888,491 | A | 3/1999 | Mitra et al. |
| 5,891,958 | A | 4/1999 | Nambu |
| 6,010,751 | A | 1/2000 | Shaw |
| 6,045,864 | A | 4/2000 | Lyons |
| 6,169,140 | B1 | 1/2001 | Roesler |
| 6,214,422 | B1 | 4/2001 | Yializis |
| 6,231,939 | B1 | 5/2001 | Shaw |
| 6,335,479 | B1 | 1/2002 | Yamada |
| 6,358,863 | B1 | 3/2002 | Desu |
| 6,413,645 | B1 | 7/2002 | Graff |
| 6,522,067 | B1 | 2/2003 | Graff |
| 6,531,560 | B1 | 3/2003 | Campbell |
| 6,548,912 | B1 | 4/2003 | Graff |
| 6,573,652 | B1 | 6/2003 | Graff |
| 6,815,043 | B2 | 11/2004 | Fleming |
| 6,835,950 | B2 | 12/2004 | Brown |
| 6,852,393 | B2 | 2/2005 | Gandon |
| 6,866,901 | B2 | 3/2005 | Burrows |
| 7,018,713 | B2 | 3/2006 | Padiyath |
| 7,943,062 | B2 | 5/2011 | Swager |
| 8,129,205 | B2 | 3/2012 | Rana |
| 8,221,176 | B2 | 7/2012 | Yoo |
| 8,399,102 | B2 | 3/2013 | Oertli |
| 2003/0049995 | A1 | 3/2003 | Schutz |
| 2003/0203210 | A1 | 10/2003 | Graff |
| 2004/0032658 | A1 | 2/2004 | Fleming |
| 2004/0115445 | A1 | 6/2004 | Sasaki et al. |
| 2004/0195967 | A1 | 10/2004 | Padiyath et al. |
| 2004/0265602 | A1 | 12/2004 | Kobayashi |
| 2005/0047740 | A1 | 3/2005 | Gantt |
| 2005/0119421 | A1 | 6/2005 | Schindler et al. |
| 2006/0057398 | A1 | 3/2006 | Zimmermann |
| 2006/0189736 | A1 | 8/2006 | Mori |
| 2006/0251901 | A1 | 11/2006 | Armstrong et al. |
| 2006/0287408 | A1* | 12/2006 | Baikerikar ............ C03C 17/007 522/71 |
| 2007/0020451 | A1 | 1/2007 | Padiyath |
| 2007/0135572 | A1 | 6/2007 | Wolter |
| 2007/0185270 | A1 | 8/2007 | Arndt |
| 2007/0286993 | A1 | 12/2007 | Radcliffe |
| 2008/0196664 | A1 | 8/2008 | David |
| 2009/0208719 | A1 | 8/2009 | Kang |
| 2009/0214879 | A1 | 8/2009 | Jucker |
| 2010/0036054 | A1 | 2/2010 | Hutchings et al. |
| 2010/0039028 | A1 | 2/2010 | Suzuki |
| 2010/0119840 | A1 | 5/2010 | Padiyath et al. |
| 2010/0210862 | A1* | 8/2010 | Tsuchida ............ C07F 7/1804 556/421 |
| 2011/0081502 | A1 | 4/2011 | Bright |
| 2011/0223434 | A1* | 9/2011 | Roehrig ............ C23C 14/027 428/448 |
| 2012/0003448 | A1 | 1/2012 | Weigel |
| 2012/0003451 | A1 | 1/2012 | Weigel |
| 2012/0003484 | A1 | 1/2012 | Roehrig et al. |
| 2012/0160402 | A1 | 6/2012 | Ho |
| 2012/0164434 | A1 | 6/2012 | Ramadas |
| 2012/0301634 | A1 | 11/2012 | Nakamura |
| 2012/0301635 | A1 | 11/2012 | Hasegawa |
| 2013/0164546 | A1 | 6/2013 | Oertli |
| 2013/0260144 | A1 | 10/2013 | Yamazaki |
| 2013/0323519 | A1 | 12/2013 | Klun |
| 2015/0203707 | A1 | 7/2015 | Klun |

FOREIGN PATENT DOCUMENTS

| | | |
|---|---|---|
| EP | 2186866 A | 5/2010 |
| EP | 2529926 A | 12/2012 |
| EP | 2618383 A | 7/2013 |
| JP | 1-110572 | 4/1989 |
| JP | H01-304108 A | 12/1989 |
| JP | 2-130139 | 5/1990 |
| JP | H02-133338 A | 5/1990 |
| JP | H08-512256 A | 12/1996 |
| JP | H11-503937 A | 4/1999 |
| JP | 2001-270859 | 10/2001 |
| JP | 2001-284610 A | 10/2001 |
| JP | 2003-238795 | 8/2003 |
| JP | 2004-35591 | 2/2004 |
| JP | 2005-122147 A | 5/2005 |
| JP | 2006-525152 A | 11/2006 |
| JP | 2008-111025 | 5/2008 |
| JP | 2009-246360 | 10/2009 |
| JP | 2009242604 | 10/2009 |
| JP | 2009-256575 A | 11/2009 |
| JP | 2010-023234 A | 2/2010 |
| JP | 2010-121013 A | 3/2010 |
| JP | 2010-111846 A | 5/2010 |
| JP | 2010-215902 | 9/2010 |
| JP | 2011-079926 | 4/2011 |
| JP | 2011-079926 A | 4/2011 |
| JP | 2013-035275 A | 2/2013 |
| JP | 2005528250 A | 9/2015 |
| JP | 2015-530427 A | 10/2015 |
| JP | 2015-532663 A | 12/2015 |
| KR | 2009-0113576 | 11/2009 |
| KR | 2011-0001334 | 1/2011 |
| WO | WO 2000-26973 | 5/2000 |
| WO | WO 2001-98393 | 12/2001 |
| WO | WO 2002-102812 | 12/2002 |
| WO | WO 2006/109496 A1 | 10/2006 |
| WO | WO 2006/132180 A | 12/2006 |
| WO | WO 2008-122292 | 10/2008 |
| WO | WO 2009-126115 | 10/2009 |
| WO | WO 2010/0044321 | 4/2010 |
| WO | WO 2010-056559 | 12/2010 |
| WO | WO 2010/056559 | * 12/2010 |
| WO | WO 2011/086958 | 7/2011 |
| WO | WO 2011/093286 A1 | 8/2011 |
| WO | WO 2011093286 A1 | 8/2011 |
| WO | WO 2011/129413 | 10/2011 |
| WO | WO 2012/003198 A2 | 1/2012 |
| WO | WO 2012-003416 | 1/2012 |
| WO | WO 2012/003417 | 1/2012 |
| WO | WO 2012074030 A1 | 6/2012 |
| WO | WO 2012-106184 | 8/2012 |

(56) References Cited

FOREIGN PATENT DOCUMENTS

| WO | WO 2014-025384 | 2/2014 |
|---|---|---|
| WO | WO 2014-025385 | 2/2014 |
| WO | WO 2014-025386 | 2/2014 |
| WO | WO 2014-025387 | 2/2014 |

OTHER PUBLICATIONS

Affinito, "Vacuum Deposited Polymer/Metal Multilayer Films for Optical Application", Thin Solid Films, 1995, vol. 270, pp. 43-48.
Ling, "Synthesis and Characterization of new monomers and Polymers Containing Hindered Piperidine Groups", Journal of macromolecular Science, Part A: Pure and Applied Chemistry, 1998, vol. A35, No. 7&8, pp. 1327-1336.
Ling, "Synthesis and Polymerization of New Methacryloyl Ureas Carrying a Hindered Piperidine and a Hydroxyl Group", Journal of Macromolecular Science Part A: Pure and Applied Chemistry, 2001, vol. A38, No. 2, pp. 137-158.
Plueddemann, "New Coupling Agents for improved Corrosion Resistant Composites", Polymer-Plastics Technology and Engineering, Sep./Dec. 1986, pp. 223-231.
Shaw, "A New Vapor Deposition Process for Coating Paper and Polymer Webs", Technical paper Presented at The Sixth International Vacuum Web Coating Conference in Reno, Oct. 28, 1992, pp. 18-24.
Shaw, RadTec' 96 North America UV/EB Conference Proceedings, "Use of Evaporated Acrylate Coatings to Smooth the Surface of Polyester and Polypropylene Film Substrates", 701-707 (1996).
Shaw, "Use of Vapor Deposited Acrylate Coatings to Improve the Barrier Properties of Metallized Film", Society of Vacuum Coaters 37th Annual Technical Conference Proceedings, 1994, pp. 240-247.
Shaw, "A New High Speed Process for Vapor Depositing Acrylate Thin Films: An Update", Society of Vacuum Coaters 36th Annual Technical Conference Proceedings, 1993, pp. 348-351.
Swanson, "Measurement of Web Curl", Applied Web Handling Conference 2006, 2006, 30 pages.
International Search Report for PCT International Application No. PCT/US2013/028499 dated Jun. 21, 2013, 3 pages.
Saunders and Frisch, "Polyurethanes: Chemistry and Technology" 1963 (Part I) and 1964 (Part II), Interscience Publishers, New York.
A. Matei; Functionalized ormosil scaffolds processed by direct laser polymerization for application in tissue engineering; Applied Surface Science, Oct. 26, 2012; vol. 278, p. 357-361.
Photopolymerization experiments and properties of some urehtane/urea methacrylates tested in dental composites, retrieved Jul. 25, 2017.

* cited by examiner

US 10,804,419 B2

PHOTOVOLTAIC DEVICES WITH ENCAPSULATING BARRIER FILM

CROSS REFERENCE TO RELATED APPLICATIONS

This application is a continuation of U.S. application Ser. No. 14/419,534, filed Feb. 4, 2015, which is a US 371 Application based on PCT/US2013/028499, filed on Mar. 1, 2013, which claims the benefit of U.S. Provisional Application No. 61/681,051, filed Aug. 8, 2012, the disclosures of which are incorporated by reference in their entirety herein.

GOVERNMENT RIGHTS

This invention was made with Government support under Cooperative Agreement DE-EE0004739 awarded by the US Department of Energy. The Government has certain rights in this invention.

FIELD

The present disclosure relates to photovoltaic devices including an encapsulating composite film. More particularly, the disclosure relates to photovoltaic devices including a multilayer barrier film having a vapor-deposited protective (co)polymer layer.

BACKGROUND

Inorganic or hybrid inorganic/organic layers have been used in thin films for electrical, packaging and decorative applications. These layers can provide desired properties such as mechanical strength, thermal resistance, chemical resistance, abrasion resistance, moisture barriers, and oxygen barriers. Highly transparent multilayer barrier coatings have also been developed to protect sensitive materials from damage due to water vapor. The moisture sensitive materials can be electronic components such as organic, inorganic, and hybrid organic/inorganic semiconductor devices. The multilayer barrier coatings can be deposited directly on the moisture sensitive material, or can be deposited on a flexible transparent substrate such as a (co)polymer film.

Multilayer barrier coatings can be prepared by a variety of production methods. These methods include liquid coating techniques such as solution coating, roll coating, dip coating, spray coating, spin coating; and dry coating techniques such as Chemical Vapor Deposition (CVD), Plasma Enhanced Chemical Vapor Deposition (PECVD), sputtering and vacuum processes for thermal evaporation of solid materials. One approach for multilayer barrier coatings has been to produce multilayer oxide coatings, such as aluminum oxide or silicon oxide, interspersed with thin (co)polymer film protective layers. Each oxide/(co)polymer film pair is often referred to as a "dyad", and the alternating oxide/(co)polymer multilayer construction can contain several dyads to provide adequate protection from moisture and oxygen. Examples of such transparent multilayer barrier coatings and processes can be found, for example, in U.S. Pat. No. 5,440,446 (Shaw et al.); U.S. Pat. No. 5,877,895 (Shaw et al.); U.S. Pat. No. 6,010,751 (Shaw et al.); U.S. Pat. No. 7,018,713 (Padiyath et al.); and U.S. Pat. No. 6,413,645 (Graff et al.).

SUMMARY

In one aspect, the present disclosure features an encapsulated device including a photovoltaic cell and a composite film overlaying at least a portion of the photovoltaic cell, the composite film further including a substrate, a base (co)polymer layer on a major surface of the substrate, an oxide layer on the base (co)polymer layer, and a protective (co)polymer layer on the oxide layer.

In some exemplary embodiments, the protective (co)polymer layer includes the reaction product of at least one urea (multi)-(meth)acrylate (multi)-silane precursor compound of the formula $R_S$—N($R^5$)—C(O)—N(H)—$R_A$. $R_S$ is a silane containing group of the formula —$R^1$—[Si($Y_p$)($R^2$)$_{3-p}$]$_q$, in which $R^1$ is a multivalent alkylene, arylene, alkarylene, or aralkylene group, said alkylene, arylene, alkarylene, or aralkylene groups optionally containing one or more catenary oxygen atoms, each Y is a hydrolysable group, $R^2$ is a monovalent alkyl or aryl group, p is 1, 2, or 3, and q is 1-5. Additionally, $R_A$ is a (meth)acryl group containing group of the formula $R^{11}$-(A)$_n$, in which $R^{11}$ is a polyvalent alkylene, arylene, alkarylene, or aralkylene group, said alkylene, arylene, alkarylene, or aralkylene groups optionally containing one or more catenary oxygen atoms, A is a (meth)acryl group having the formula $X^2$—C(O)—C($R^3$)=$CH_2$, in which $X^2$ is —O, —S, or —$NR^3$, $R^3$ is H, or $C_1$-$C_4$, and n=1 to 5. $R^5$ is H, $C_1$ to $C_6$ alkyl or cycloalkyl, or $R_S$, with the proviso that at least one of the following conditions applies: n is 2 to 5, $R^5$ is $R_S$, or q is 2 to 5.

In other exemplary embodiments, the protective (co)polymer layer includes the reaction product of at least one urea (multi)-(meth)acrylate (multi)-silane precursor compound of the formula $R_{S1}$—N($R^4$)—C(O)—N(H)—$R_{A1}$. $R_{S1}$ is a silane containing group of the formula —$R^{1d}$—Si($Y_p$)($R^2$)$_{3-p}$, in which $R^{1d}$ is a divalent alkylene, arylene, alkarylene, or aralkylene group, said alkylene, arylene, alkarylene, or aralkylene groups optionally containing one or more catenary oxygen atoms, each Y is a hydrolysable group, $R^2$ is a monovalent alkyl or aryl group, and p is 1, 2, or 3. Additionally, $R^4$ is H, $C_1$ to $C_6$ alkyl or $C_1$ to $C_6$ cycloalkyl. $R_{A1}$ is a (meth)acryl containing group of the formula $R^{11d}$-(A), in which $R^{11d}$ is a divalent alkylene, arylene, alkarylene, or aralkylene group, said alkylene, arylene, alkarylene, or aralkylene groups optionally containing one or more catenary oxygen atoms, and A is a (meth)acryl group having the formula $X^2$—C(O)—C($R^3$)=$CH_2$, in which $X^2$ is —O, —S, or —$NR^3$, and $R^3$ is H, or $C_1$-$C_4$.

In additional exemplary embodiments, the protective (co)polymer layer includes the reaction product of at least one urethane (multi)-(meth)acrylate (multi)-silane precursor compound of the formula $R_S$—N(H)—C(O)—O—$R_A$ or $R_S$—O—C(O)—N(H)—$R_A$. $R_S$ is a silane containing group of the formula —$R^1$—[Si($Y_p$)($R^2$)$_{3-p}$]$_q$, in which $R^1$ is a multivalent alkylene, arylene, alkarylene, or aralkylene group, said alkylene, arylene, alkarylene, or aralkylene groups optionally containing one or more catenary oxygen atoms, each Y is a hydrolysable group, $R^2$ is a monovalent alkyl or aryl group; p is 1, 2, or 3, and q is 1-5. Additionally, $R_A$ is a (meth)acryl group containing group of the formula $R^{11}$-(A)$_n$, in which $R^{11}$ is a polyvalent alkylene, arylene, alkarylene, or aralkylene group, said alkylene, arylene, alkarylene, or aralkylene groups optionally containing one or more catenary oxygen atoms, A is a (meth)acryl group comprising the formula $X^2$—C(O)—C($R^3$)=$CH_2$, in which $X^2$ is —O, —S, or —$NR^3$, $R^3$ is H, or $C_1$-$C_4$, and n=1 to 5.

In additional exemplary embodiments, the protective (co)polymer layer includes the reaction product of at least one urea (multi)-urethane (meth)acrylate-silane precursor compound of the formula $R_A$—NH—C(O)—N($R^4$)—$R^{11}$—[O—C(O)NH—$R_S$]$_n$. $R_A$ is a (meth)acryl containing group of the formula $R^{11}$-$(A)_n$, in which $R^{11}$ is a polyvalent alkylene, arylene, alkarylene, or aralkylene group, said alkylene, arylene, alkarylene, or aralkylene groups optionally containing one or more catenary oxygen atom, A is a (meth)acryl group comprising the formula $X^2$—C(O)—C($R^3$)=$CH_2$, in which $X^2$ is —O, —S, or —$NR^3$, $R^3$ is independently H, or $C_1$-$C_4$, and n=1 to 5. Additionally, $R^4$ is H, $C_1$ to $C_6$ alkyl, or $C_1$ to $C_6$ cycloalkyl. $R_S$ is a silane containing group of the formula —$R^1$—Si($Y_p$)($R^2$)$_{3-p}$, in which $R^1$ is a polyvalent alkylene, arylene, alkarylene, or aralkylene group, said alkylene, arylene, alkarylene, or aralkylene groups optionally containing one or more catenary oxygen atoms, Y is a hydrolysable group, $R^2$ is a monovalent alkyl or aryl group, and p is 1, 2, or 3.

In yet further exemplary embodiments, the protective (co)polymer layer includes the reaction product of at least one urea (multi)-urethane (meth)acrylate-silane precursor compound of the formula $R_S$—NH—C(O)—N($R^4$)—$R^{11}$—[O—C(O)—NH—$R_A$]$_n$. $R_S$ is a silane containing group of the formula —$R^1$—Si($Y_p$)($R^2$)$_{3-p}$, in which $R^1$ is a polyvalent alkylene, arylene, alkarylene, or aralkylene group, said alkylene, arylene, alkarylene, or aralkylene groups optionally containing one or more catenary oxygen atoms, Y is a hydrolysable group, $R^2$ is a monovalent alkyl or aryl group, and p is 1,2, or 3. Additionally, $R^4$ is H, $C_1$ to $C_6$ alkyl, or $C_1$ to $C_6$ cycloalkyl. $R_A$ is a (meth)acryl group containing group of the formula $R^{11}$-$(A)_n$, in which $R^{11}$ is a polyvalent alkylene, arylene, alkarylene, or aralkylene group, said alkylene, arylene, alkarylene, or aralkylene group optionally containing one or more catenary oxygen atom, A is a (meth)acryl containing group of the formula $X^2$—C(O)—C($R^3$)=$CH_2$, in which $X^2$ is —O, —S, or —$NR^3$, $R^3$ is independently H, or $C_1$-$C_4$; and n=1 to 5.

In still another exemplary embodiment, the protective (co)polymer layer includes the reaction product of at least one urethane (multi)-(meth)acrylate (multi)-silane precursor compound of the formula $R_S$—N(H)—C(O)—O—$R_A$ or $R_S$—O—C(O)—N(H)—$R_A$. $R_S$ is a silane containing group of the formula —$R^1$—[Si($Y_p$)($R^2$)$_{3-p}$]$_q$, in which $R^1$ is a multivalent alkylene, arylene, alkarylene, or aralkylene group, said alkylene, arylene, alkarylene, or aralkylene groups optionally containing one or more catenary oxygen atoms, each Y is a hydrolysable group, $R^2$ is a monovalent alkyl or aryl group, p is 1, 2, or 3, and q is 1-5. Additionally, $R_A$ is a (meth)acryl containing group of the formula $R^{11}$-$(A)_n$, in which $R^{11}$ is a polyvalent alkylene, arylene, alkarylene, or aralkylene group, said alkylene, arylene, alkarylene, or aralkylene groups optionally containing one or more catenary oxygen atoms, A is a (meth)acryl group comprising the formula $X^2$—C(O)—C($R^3$)=$CH_2$, in which $X^2$ is —O, —S, or —$NR^3$, $R^3$ is H, or $C_1$-$C_4$, and n=1 to 5.

In any of the foregoing exemplary embodiments, each hydrolysable group Y is independently selected from an alkoxy group, an acetate group, an aryloxy group, and a halogen. In any of the foregoing exemplary embodiments, at least some of the hydrolysable groups Y are alkoxy groups. In other exemplary embodiments of any of the foregoing, at least some of the hydrolysable groups Y are chlorine.

In any of the foregoing embodiments, the composite film may include a multiplicity of alternating layers of the oxide layer and the protective (co)polymer layer on the base (co)polymer layer. In any of the foregoing exemplary embodiments, the substrate includes a flexible transparent (co)polymeric film, optionally wherein the substrate comprises polyethylene terephthalate (PET), polyethylene napthalate (PEN), heat stabilized PET, heat stabilized PEN, polyoxymethylene, polyvinylnaphthalene, polyetheretherketone, fluoro(co)polymer, polycarbonate, polymethylmethacrylate, poly α-methyl styrene, polysulfone, polyphenylene oxide, polyetherimide, polyethersulfone, polyamideimide, polyimide, polyphthalamide, or combinations thereof.

In any of the foregoing embodiments, the base (co)polymer layer may include a (meth)acrylate smoothing layer. In any of the foregoing embodiments, the oxide layer may include oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof. In any of the foregoing embodiments, the composite film may further include an oxide layer applied to the protective (co)polymer layer, optionally wherein the oxide layer comprises silicon aluminum oxide.

Exemplary embodiments of the present disclosure provide photovoltaic devices including an encapsulating composite film, which exhibit improved moisture resistance when used in high moisture (e.g. high humidity) applications. Exemplary embodiments of the disclosure can enable the formation of encapsulated photovoltaic devices that exhibit superior mechanical properties such as elasticity and flexibility yet still have low oxygen or water vapor transmission rates.

Exemplary embodiments of photovoltaic devices including a barrier film according to the present disclosure are preferably transmissive to both visible and infrared light. Exemplary barrier films according to the present disclosure are also typically flexible. Exemplary barrier films according to the present disclosure generally do not exhibit delamination or curl that can arise from thermal stresses or shrinkage in a multilayer structure. The properties of exemplary embodiments of barrier films disclosed herein typically are maintained even after high temperature and humidity aging.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The accompanying drawings are incorporated in and constitute a part of this specification and, together with the description, explain the advantages and principles of exemplary embodiments of the present disclosure.

Like reference numerals in the drawings indicate like elements. The drawings herein are not drawn to scale, and in the drawings, the illustrated elements are sized to emphasize selected features.

DETAILED DESCRIPTION

Glossary

Figure 1:
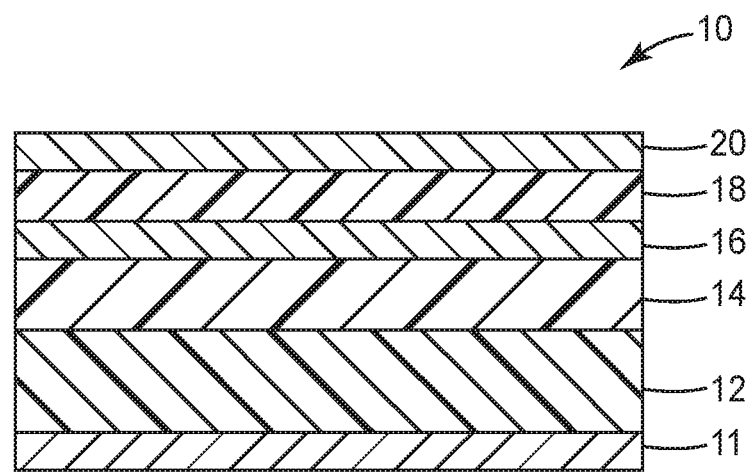
FIG. 1 is a diagram illustrating a photovoltaic device including an exemplary moisture-resistant barrier film having a vapor-deposited adhesion-promoting coating according to an exemplary embodiment of the present disclosure.

Certain terms are used throughout the description and the claims that, while for the most part are well known, may require some explanation. It should understood that, as used herein, The words "a", "an", and "the" are used interchangeably with "at least one" to mean one or more of the elements being described.

By using words of orientation such as "atop", "on", "covering", "uppermost", "underlying" and the like for the location of various elements in the disclosed coated articles, we refer to the relative position of an element with respect to a horizontally-disposed, upwardly-facing substrate. It is not intended that the substrate or articles should have any particular orientation in space during or after manufacture.

By using the term "overcoated" to describe the position of a layer with respect to a substrate or other element of a barrier film of the disclosure, we refer to the layer as being atop the substrate or other element, but not necessarily contiguous to either the substrate or the other element.

By using the term "separated by" to describe the position of a (co)polymer layer with respect to two inorganic barrier layers, we refer to the (co)polymer layer as being between the inorganic barrier layers but not necessarily contiguous to either inorganic barrier layer. The term "barrier film" or "barrier layer" refers to a film or layer which is designed to be impervious to vapor, gas or aroma migration. Exemplary gases and vapors that may be excluded include oxygen and/or water vapor.

The term "(meth)acrylate" with respect to a monomer, oligomer or compound means a vinyl-functional alkyl ester formed as the reaction product of an alcohol with an acrylic or a methacrylic acid.

The term "polymer" or "(co)polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

The term "cure" refers to a process that causes a chemical change, e.g., a reaction via consumption of water, to solidify a film layer or increase its viscosity.

The term "cross-linked" (co)polymer refers to a (co)polymer whose (co)polymer chains are joined together by covalent chemical bonds, usually via cross-linking molecules or groups, to form a network (co)polymer. A cross-linked (co)polymer is generally characterized by insolubility, but may be swellable in the presence of an appropriate solvent.

The term "cured (co)polymer" includes both cross-linked and uncross-linked (co)polymers.

The term "$T_g$," refer to the glass transition temperature of a cured (co)polymer when evaluated in bulk rather than in a thin film form. In instances where a (co)polymer can only be examined in thin film form, the bulk form $T_g$ can usually be estimated with reasonable accuracy. Bulk form $T_g$ values usually are determined by evaluating the rate of heat flow vs. temperature using differential scanning calorimetry (DSC) to determine the onset of segmental mobility for the (co)polymer and the inflection point (usually a second-order transition) at which the (co)polymer can be said to change from a glassy to a rubbery state. Bulk form $T_g$ values can also be estimated using a dynamic mechanical thermal analysis (DMTA) technique, which measures the change in the modulus of the (co)polymer as a function of temperature and frequency of vibration.

By using the term "visible light-transmissive" support, layer, assembly or device, we mean that the support, layer, assembly or device has an average transmission over the visible portion of the spectrum, $T_{vis}$, of at least about 20%, measured along the normal axis.

The term "metal" includes a pure metal (i.e. a metal in elemental form such as, for example silver, gold, platinum, and the like) or a metal alloy.

The term "vapor coating" or "vapor depositing" means applying a coating to a substrate surface from a vapor phase, for example, by evaporating and subsequently depositing onto the substrate surface a precursor material to the coating or the coating material itself. Exemplary vapor coating processes include, for example, physical vapor deposition (PVD), chemical vapor deposition (CVD), and combinations thereof.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Identification of a Problem to be Solved

Flexible barrier coatings or films are desirable for electronic devices, such as photovoltaic devices, whose components are sensitive to the ingress of water vapor. A multilayer barrier coating or film may provide advantages over glass as it is flexible, light-weight, durable, and enables low cost continuous roll-to-roll processing.

Each of the known methods for producing a multilayer barrier coating or film has limitations. Chemical deposition methods (CVD and PECVD) form vaporized metal alkoxide precursors that undergo a reaction, when adsorbed on a substrate, to form inorganic coatings. These processes are generally limited to low deposition rates (and consequently low line speeds), and make inefficient use of the alkoxide precursor (much of the alkoxide vapor is not incorporated into the coating). The CVD process also requires high substrate temperatures, often in the range of 300-500° C., which may not be suitable for (co)polymer substrates.

Vacuum processes such as thermal evaporation of solid materials (e.g., resistive heating or e-beam heating) also provide low metal oxide deposition rates. Thermal evaporation is difficult to scale up for roll wide web applications requiring very uniform coatings (e.g., optical coatings) and can require substrate heating to obtain quality coatings. Additionally, evaporation/sublimation processes can require ion-assist, which is generally limited to small areas, to improve the coating quality.

Sputtering has also been used to form metal oxide layers. While the deposition energy of the sputter process used for forming the barrier oxide layer is generally high, the energy involved in depositing the (meth)acrylate layers is generally low. As a result the (meth)acrylate layer typically does not have good adhesive properties with the layer below it, for example, an inorganic barrier oxide sub-layer. To increase the adhesion level of the protective (meth)acrylate layer to the barrier oxide, a thin sputtered layer of silicon sub-oxide is known to be useful in the art. If the silicon sub oxide layer is not included in the stack, the protective (meth)acrylate layer has poor initial adhesion to the barrier oxide. The silicon sub oxide layer sputter process must be carried out with precise power and gas flow settings to maintain adhesion performance. This deposition process has historically been susceptible to noise resulting in varied and low adhesion of the protective (meth)acrylate layer. It is therefore desirable to eliminate the need for a silicon sub oxide layer in the final barrier construct for increased adhesion robustness and reduction of process complexity.

Even when the "as deposited" adhesion of the standard barrier stack is initially acceptable, the sub oxide and protective (meth)acrylate layer has demonstrated weakness when exposed to accelerated aging conditions of 85° C./85% relative humidity (RH). This inter-layer weakness can result in premature delamination of the barrier film from the devices it is intended to protect. It is desirable that the multi-layer construction improves upon and maintains initial adhesion levels when aged in 85° C. and 85% RH.

One solution to this problem is to use what is referred to as a "tie" layer of particular elements such chromium, zirconium, titanium, silicon and the like, which are often sputter deposited as a mono- or thin-layer of the material either as the element or in the presence of small amount of oxygen. The tie layer element can then form chemical bonds to both the substrate layer, an oxide, and the capping layer, a (co)polymer.

Tie layers are generally used in the vacuum coating industry to achieve adhesion between layers of differing materials. The process used to deposit the layers often requires fine tuning to achieve the right layer concentration of tie layer atoms. The deposition can be affected by slight variations in the vacuum coating process such as fluctuation in vacuum pressure, out-gassing, and cross contamination from other processes resulting in variation of adhesion levels in the product. In addition, tie layers often do not retain their initial adhesion levels after exposure to water vapor. A more robust solution for adhesion improvement in barrier films is desirable.

Discovery of a Solution to the Problem

We have surprisingly discovered that a photovoltaic device including a composite film comprising a protective (co)polymer layer comprising the reaction product of at least one silane precursor compound as described further below, improves the adhesion and moisture barrier performance of a multilayer composite barrier film. These multilayer composite barrier films have a number of applications in the photovoltaic, display, lighting, and electronic device markets as flexible replacements for glass encapsulating materials.

In exemplary embodiments of the present disclosure, the desired technical effects and solution to the technical problem to obtain improved multilayer composite barrier films were obtained by chemically modifying the compositions used in the process for applying (e.g., by vapor coating) a protective (co)polymer layer to a multilayer composite barrier film to achieve, in some exemplary embodiments:

1) a robust chemical bond with an inorganic oxide surface,
2) a robust chemical bond to the (meth)acrylate coating through (co)polymerization, and
3) the maintenance of some of the physical properties of the modified molecules (e.g., boiling point, vapor pressure, and the like) such that they can be co-evaporated with a bulk (meth)acrylate material.

Multilayer Composite Barrier Films

Thus, in exemplary embodiments, the disclosure describes a multilayer composite barrier film comprising a substrate, a base (co)polymer layer on a major surface of the substrate, an oxide layer on the base (co)polymer layer; and a protective (co)polymer layer on the oxide layer, the protective (co)polymer layer comprising the reaction product of a silane precursor compound, as described further below.

Turning to the drawings, FIG. 1 is a diagram of a photovoltaice device 11 covered by an exemplary barrier film 10 having a moisture resistant coating comprising a single dyad. Film 10 includes layers arranged in the following order: a substrate 12; a base (co)polymer layer 14; an oxide layer 16; a protective (co)polymer layer 18 comprising the reaction product of at least one urea (multi)-(meth)acrylate (multi)-silane precursor compound as described herein; and an optional oxide layer 20. Oxide layer 16 and protective (co)polymer layer 18 together form a dyad and, although only one dyad is shown, film 10 can include additional dyads of alternating oxide layer 16 and protective (co)polymer layer 18 between substrate 10 and the uppermost dyad.

In certain exemplary embodiments, the composite barrier film comprises a plurality of alternating layers of the oxide layer and the protective (co)polymer layer on the base (co)polymer layer. The oxide layer and protective (co)polymer layer together form a "dyad", and in one exemplary embodiment, the barrier film can include more than one dyad, forming a multilayer barrier film. Each of the oxide layers and/or protective (co)polymer layers in the multilayer barrier film (i.e. including more than one dyad) can be the same or different. An optional inorganic layer, which preferably is an oxide layer, can be applied over the plurality of alternating layers or dyads.

In some exemplary embodiments, protective (co)polymer layer 18 comprising the reaction product of at least silane precursor compound improves the moisture resistance of film 10 and the peel strength adhesion of protective (co)polymer layer 18 to the underlying oxide layer, leading to improved adhesion and delamination resistance within the further barrier stack layers, as explained further below. Presently preferred materials for use in the barrier film 10 are also identified further below, and in the Examples.

Protective Polymer Layers

The present disclosure describes protective (co)polymer layers used in composite films (i.e. as barrier films) useful in reducing oxygen and/or water vapor barrier transmission when used as packaging materials, for example, to package electronic devices. Each protective (co)polymer layer includes in its manufacture at least one composition of matter described herein as a silane precursor compound, the reaction product thereof forms a (co)polymer, as described further below.

Suitable protective (co)polymer layers comprising the reaction product of a silane precursor compound, as well as suitable silane precursor compounds, multilayer composite barrier films including such (co)polymer layers, methods of using such silane precursor compounds to form composite films suitable for use as an encapsulating multilayer composite barrier film for a photovoltaic device, and examples thereof, are described in U.S. Provisional Patent Application Nos. 61/681,023; 61/681,008; 61/681,003; and 61/680,995, all filed Aug. 8, 2012.

Composite Film Materials

The present disclosure describes protective (co)polymer layers comprising the reaction product of at least silane precursor compound with at least one (meth)acrylate monomer or oligomer and/or water.

Substrates

Substrate 12 can be a flexible, visible light-transmissive substrate, such as a flexible light transmissive (co)polymeric film. In one presently preferred exemplary embodiment, the substrates are substantially transparent, and can have a visible light transmission of at least about 50%, 60%, 70%, 80%, 90% or even up to about 100% at 550 nm.

Exemplary flexible light-transmissive substrates include thermoplastic polymeric films including, for example, polyesters, polyacrylates (e.g., polymethyl methacrylate), polycarbonates, polypropylenes, high or low density polyethylenes, polysulfones, polyether sulfones, polyurethanes, polyamides, polyvinyl butyral, polyvinyl chloride, fluoropolymers (e.g., polyvinylidene difluoride, ethylenetetrafluoroethylene (ETFE) (co)polymers, terafluoroethylene (co)polymers, hexafluoropropylene (co)polymers, polytetrafluoroethylene, and copolymers thereof), polyethylene sulfide, cyclic olefin (co)polymers, and thermoset films such as epoxies, cellulose derivatives, polyimide, polyimide benzoxazole and polybenzoxazole.

Presently preferred polymeric films comprise polyethylene terephthalate (PET), polyethylene napthalate (PEN), heat stabilized PET, heat stabilized PEN, polyoxymethylene, polyvinylnaphthalene, polyetheretherketone, fluoropolymer, polycarbonate, polymethylmethacrylate, poly α-methyl styrene, polysulfone, polyphenylene oxide, polyetherimide, polyethersulfone, polyamideimide, polyimide, polyphthalamide, or combinations thereof.

In some exemplary embodiments, the substrate can also be a multilayer optical film ("MOF"), such as those described in U.S. Patent Application Publication No. US 2004/0032658 A1. In one exemplary embodiment, the films can be prepared on a substrate including PET.

The substrate may have a variety of thicknesses, e.g., about 0.01 to about 1 mm. The substrate may however be considerably thicker, for example, when a self-supporting article is desired. Such articles can conveniently also be made by laminating or otherwise joining a disclosed film made using a flexible substrate to a thicker, inflexible or less flexible supplemental support.

The (co)polymeric film can be heat-stabilized, using heat setting, annealing under tension, or other techniques that will discourage shrinkage up to at least the heat stabilization temperature when the (co)polymeric film is not constrained.

Base (Co)Polymer Layer

Returning to FIG. 1, the base (co)polymer layer 14 can include any (co)polymer suitable for deposition in a thin film. In one aspect, for example, the base (co)polymer layer 14 can be formed from various precursors, for example, (meth)acrylate monomers and/or oligomers that include acrylates or methacrylates such as urethane (meth)acrylates, isobornyl (meth)acrylate, dipentaerythritol penta(meth)acrylate, epoxy (meth)acrylates, epoxy (meth)acrylates blended with styrene, di-trimethylolpropane tetra(meth)acrylate, diethylene glycol di(meth)acrylate, 1,3-butylene glycol di(meth)acrylate, penta(meth)acrylate esters, pentaerythritol tetra(meth)acrylate, pentaerythritol tri(meth)acrylate, ethoxylated (3) trimethylolpropane tri(meth)acrylate, ethoxylated (3) trimethylolpropane tri(meth)acrylate, alkoxylated trifunctional (meth)acrylate esters, dipropylene glycol di(meth)acrylate, neopentyl glycol di(meth)acrylate, ethoxylated (4) bisphenol a di(metha)crylate, cyclohexane dimethanol di(meth)acrylate esters, isobornyl (meth)acrylate, cyclic di(meth)acrylates, tris (2-hydroxy ethyl) isocyanurate tri(meth)acrylate, and (meth)acrylate compounds (e.g., oligomers or polymers) formed from the foregoing acrylates and methacrylates. Preferably, the base (co)polymer precursor comprises a (meth)acrylate monomer.

The base (co)polymer layer 14 can be formed by applying a layer of a monomer or oligomer to the substrate and cross-linking the layer to form the (co)polymer in situ, e.g., by flash evaporation and vapor deposition of a radiation-cross-linkable monomer, followed by cross-linking using, for example, an electron beam apparatus, UV light source, electrical discharge apparatus or other suitable device. Coating efficiency can be improved by cooling the substrate.

The monomer or oligomer can also be applied to the substrate 12 using conventional coating methods such as roll coating (e.g., gravure roll coating) or spray coating (e.g., electrostatic spray coating), then cross-linked as set out above. The base (co)polymer layer 14 can also be formed by applying a layer containing an oligomer or (co)polymer in solvent and drying the thus-applied layer to remove the solvent. Chemical Vapor Deposition (CVD) may also be employed in some cases.

Preferably, the base (co)polymer layer 14 is formed by flash evaporation and vapor deposition followed by cross-linking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al. and U.S. Pat. No. 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum Deposited Polymer/Metal Multilayer Films for Optical Application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

In some exemplary embodiments, the smoothness and continuity of the base (co)polymer layer 14 (and also each oxide layer 16 and protective (co)polymer layer 18) and its adhesion to the underlying substrate or layer may be enhanced by appropriate pretreatment. Examples of a suitable pretreatment regimen include an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied (co)polymeric (or inorganic) layer. Plasma pretreatment can be particularly useful.

In some exemplary embodiments, a separate adhesion promotion layer which may have a different composition than the base (co)polymer layer 14 may also be used atop the substrate or an underlying layer to improve adhesion. The adhesion promotion layer can be, for example, a separate (co)polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the base (co)polymer layer will depend in part on the nature and surface topography of the substrate. The thickness preferably is sufficient to provide a smooth, defect-free surface to which the subsequent oxide layer can be applied. For example, the base (co)polymer layer may have a thickness of a few nm (e.g., 2 or 3 nm) to about 5 micrometers, and can be thicker if desired.

As described elsewhere, the barrier film can include the oxide layer deposited directly on a substrate that includes a moisture sensitive device, a process often referred to as direct encapsulation. The moisture sensitive device can be, for example, a photovoltaic device such as a copper indium gallium di-selenide (CIGS) photovoltaic device. Flexible photovoltaic devices can be encapsulated directly with the gradient composition oxide layer. For example, the devices can be attached to a flexible carrier substrate, and a mask can be deposited to protect electrical connections from the oxide layer deposition. The base (co)polymer layer 14, the oxide layer 16 and the protective (co)polymer layer 18 can be deposited as described further below, and the mask can then be removed, exposing the electrical connections.

Oxide Layers

The improved barrier film includes at least one oxide layer 16. The oxide layer preferably comprises at least one inorganic material. Suitable inorganic materials include oxides, nitrides, carbides or borides of different atomic elements. Presently preferred inorganic materials included in the oxide layer comprise oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof. In some particular exemplary embodiments, an inorganic layer, more preferably an inorganic oxide layer, may be applied to the uppermost protective (co)polymer layer. Preferably, the oxide layer comprises silicon aluminum oxide or indium tin oxide.

In some exemplary embodiments, the composition of the oxide layer may change in the thickness direction of the layer, i.e. a gradient composition. In such exemplary embodiments, the oxide layer preferably includes at least two inorganic materials, and the ratio of the two inorganic materials changes throughout the thickness of the oxide layer. The ratio of two inorganic materials refers to the relative proportions of each of the inorganic materials. The ratio can be, for example, a mass ratio, a volume ratio, a concentration ratio, a molar ratio, a surface area ratio, or an atomic ratio.

The resulting gradient oxide layer is an improvement over homogeneous, single component layers. Additional benefits in barrier and optical properties can also be realized when combined with thin, vacuum deposited protective (co)polymer layers. A multilayer gradient inorganic-(co)polymer barrier stack can be made to enhance optical properties as well as barrier properties.

The barrier film can be fabricated by deposition of the various layers onto the substrate, in a roll-to-roll vacuum chamber similar to the system described in U.S. Pat. No. 5,440,446 (Shaw et al.) and U.S. Pat. No. 7,018,713 (Padiyath, et al.). The deposition of the layers can be in-line, and in a single pass through the system. In some cases, the barrier film can pass through the system several times, to form a multilayer barrier film having several dyads.

The first and second inorganic materials can be oxides, nitrides, carbides or borides of metal or nonmetal atomic elements, or combinations of metal or nonmetal atomic elements. By "metal or nonmetal" atomic elements is meant atomic elements selected from the periodic table Groups IIA, IIIA, IVA, VA, VIA, VIIA, IB, or IIB, metals of Groups IIIB, IVB, or VB, rare-earth metals, or combinations thereof. Suitable inorganic materials include, for example, metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, aluminum nitride, silicon nitride, boron nitride, aluminum oxynitride, silicon oxynitride, boron oxynitride, zirconium oxyboride, titanium oxyboride, and combinations thereof. ITO is an example of a special class of ceramic materials that can become electrically conducting with the proper selection of the relative proportions of each elemental constituent. Silicon-aluminum oxide and indium tin oxide are presently preferred inorganic materials forming the oxide layer 16.

For purposes of clarity, the oxide layer 16 described in the following discussion is directed toward a composition of oxides; however, it is to be understood that the composition can include any of the oxides, nitrides, carbides, borides, oxynitrides, oxyborides and the like described above.

In one embodiment of the oxide layer 16, the first inorganic material is silicon oxide, and the second inorganic material is aluminum oxide. In this embodiment, the atomic ratio of silicon to aluminum changes throughout the thickness of the oxide layer, e.g., there is more silicon than aluminum near a first surface of the oxide layer, gradually becoming more aluminum than silicon as the distance from the first surface increases. In one embodiment, the atomic ratio of silicon to aluminum can change monotonically as the distance from the first surface increases, i.e., the ratio either increases or decreases as the distance from the first surface increases, but the ratio does not both increase and decrease as the distance from the first surface increases. In another embodiment, the ratio does not increase or decrease monotonically, i.e. the ratio can increase in a first portion, and decrease in a second portion, as the distance from the first surface increases. In this embodiment, there can be several increases and decreases in the ratio as the distance from the first surface increases, and the ratio is non-monotonic. A change in the inorganic oxide concentration from one oxide species to another throughout the thickness of the oxide layer 16 results in improved barrier performance, as measured by water vapor transmission rate.

In addition to improved barrier properties, the gradient composition can be made to exhibit other unique optical properties while retaining improved barrier properties. The gradient change in composition of the layer produces corresponding change in refractive index through the layer. The materials can be chosen such that the refractive index can change from high to low, or vice versa. For example, going from a high refractive index to a low refractive index can allow light traveling in one direction to easily pass through the layer, while light travelling in the opposite direction may be reflected by the layer. The refractive index change can be used to design layers to enhance light extraction from a light emitting device being protected by the layer. The refractive index change can instead be used to pass light through the layer and into a light harvesting device such as a solar cell. Other optical constructions, such as band pass filters, can also be incorporated into the layer while retaining improved barrier properties.

In order to promote silane bonding to the oxide surface, it may be desirable to form hydroxyl silanol (Si—OH) groups on a freshly sputter deposited silicon dioxide ($SiO_2$) layer. The amount of water vapor present in a multi-process vacuum chamber can be controlled sufficiently to promote the formation of Si—OH groups in high enough surface concentration to provide increased bonding sites. With residual gas monitoring and the use of water vapor sources the amount of water vapor in a vacuum chamber can be controlled to ensure adequate generation of Si—OH groups.

Process for Making Barrier Layers and Films

The disclosure also describes a process for making a composite film comprising: (a) applying a base (co)polymer layer to a major surface of a substrate, (b) applying an oxide layer on the base (co)polymer layer, and (c) depositing on the oxide layer a protective (co)polymer layer, wherein the protective (co)polymer layer comprises a (co)polymer formed as the reaction product of at least one of the foregoing silane precursor compounds.

In some exemplary embodiments of the process, the silane precursor compound undergoes a chemical reaction to form the protective (co)polymer layer at least in part on the oxide layer. Optionally, the chemical reaction is selected from a free radical polymerization reaction, and a hydrolysis reaction. In any of the foregoing embodiments, each hydrolysable group Y is independently selected from an alkoxy group, an acetate group, an aryloxy group, and a halogen. In some particular exemplary embodiments of the foregoing composite film embodiments, at least some of the hydrolysable groups Y are chlorine and/or alkoxy.

In one exemplary presently preferred embodiment, the disclosure describes a process for making the composite barrier film, the process including:

(a) vapor depositing and curing a base (co)polymer layer onto a major surface of a substrate;

(b) vapor depositing an oxide layer on the base (co) polymer layer; and (c) vapor depositing and curing onto the oxide layer a protective (co)polymer layer, the protective (co)polymer layer comprising a (co)polymer formed as the reaction product of at least one of the foregoing urea (multi)-(meth) acrylate (multi)-silane precursor compounds of the formula $R_S$—N($R^5$)—C(O)—N(H)—$R_4$ or $R_{S1}$—N($R^4$)—C(O)—N (H)—$R_{A1}$, as previously described.

The vapor deposition process is generally limited to compositions that are pumpable (liquid-phase with an acceptable viscosity); that can be atomized (form small droplets of liquid), flash evaporated (high enough vapor pressure under vacuum conditions), condensable (vapor pressure, molecular weight), and can be cross-linked in vacuum (molecular weight range, reactivity, functionality).

Figure 2:
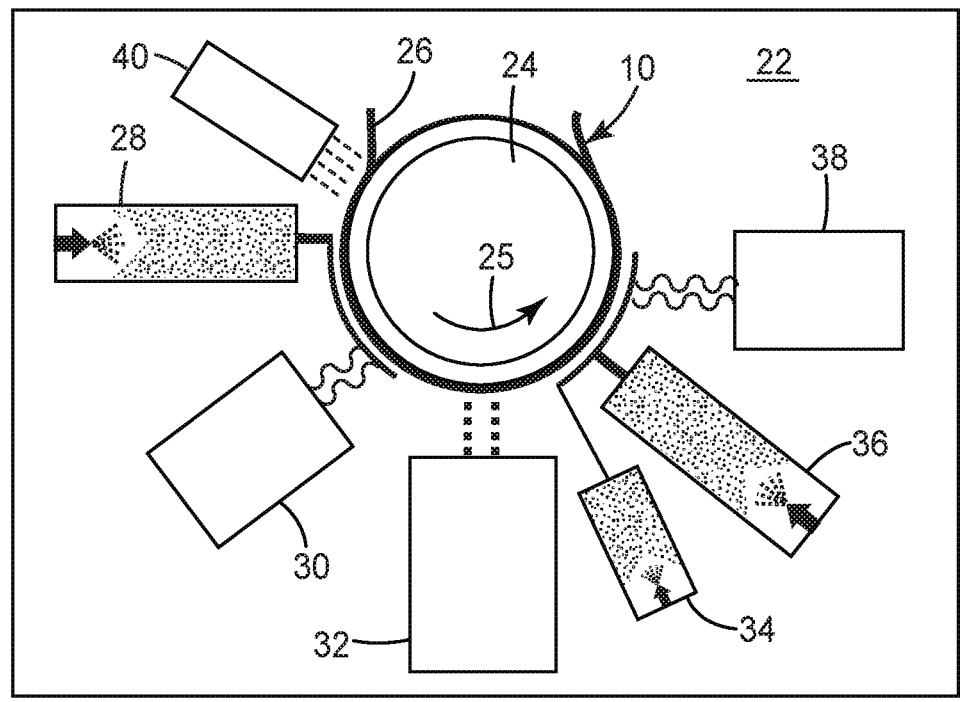
FIG. 2 is a diagram illustrating an exemplary process and apparatus for making a barrier film according to an exemplary embodiment of the present disclosure.

FIG. 2 is a diagram of a system 22, illustrating a process for making barrier film 10. System 22 is contained within an inert environment and includes a chilled drum 24 for receiving and moving the substrate 12 (FIG. 1), as represented by a film 26, thereby providing a moving web on which to form the barrier layers. Preferably, an optional nitrogen plasma treatment unit 40 may be used to plasma treat or prime film 26 in order to improve adhesion of the base (co)polymer layer 14 (FIG. 1) to substrate 12 (FIG. 1). An evaporator 28 applies a base (co)polymer precursor, which is cured by curing unit 30 to form base (co)polymer layer 14 (FIG. 1) as drum 24 advances the film 26 in a direction shown by arrow 25. An oxide sputter unit 32 applies an oxide to form layer 16 (FIG. 1) as drum 24 advances film 26.

For additional alternating oxide layers 16 and protective (co)polymer layers 18, drum 24 can rotate in a reverse direction opposite arrow 25 and then advance film 26 again to apply the additional alternating base (co)polymer and oxide layers, and that sub-process can be repeated for as many alternating layers as desired or needed. Once the base (co)polymer and oxide are complete, drum 24 further advances the film, and evaporator 36 deposits on oxide layer 16, the silane precursor compound (as described above), which is reacted or cured to form protective (co)polymer layer 18 (FIG. 1). In certain presently preferred embodiments, reacting the silane precursor compound to form a protective (co)polymer layer 18 on the oxide layer 16 occurs at least in part on the oxide layer 16.

Optional evaporator 34 may be used additionally to provide other co-reactants or co-monomers (e.g. additional protective (co)polymer compounds) which may be useful in forming the protective (co)polymer layer 18 (FIG. 1). For additional alternating oxide layers 16 and protective (co) polymer layers 18, drum 24 can rotate in a reverse direction opposite arrow 25 and then advance film 26 again to apply the additional alternating oxide layers 16 and protective (co)polymer layers 18, and that sub-process can be repeated for as many alternating layers or dyads as desired or needed.

The oxide layer 16 can be formed using techniques employed in the film metalizing art such as sputtering (e.g., cathode or planar magnetron sputtering), evaporation (e.g., resistive or electron beam evaporation), chemical vapor deposition, plating and the like. In one aspect, the oxide layer 16 is formed using sputtering, e.g., reactive sputtering. Enhanced barrier properties have been observed when the oxide layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy as occurs in sputtering, leading to a lower void fraction as a result of compaction.

In some exemplary embodiments, the sputter deposition process can use dual targets powered by an alternating current (AC) power supply in the presence of a gaseous atmosphere having inert and reactive gasses, for example argon and oxygen, respectively. The AC power supply alternates the polarity to each of the dual targets such that for half of the AC cycle one target is the cathode and the other target is the anode. On the next cycle the polarity switches between the dual targets. This switching occurs at a set frequency, for example about 40 kHz, although other frequencies can be used. Oxygen that is introduced into the process forms oxide layers on both the substrate receiving the inorganic composition, and also on the surface of the target. The dielectric oxides can become charged during sputtering, thereby disrupting the sputter deposition process. Polarity switching can neutralize the surface material being sputtered from the targets, and can provide uniformity and better control of the deposited material.

In further exemplary embodiments, each of the targets used for dual AC sputtering can include a single metal or nonmetal element, or a mixture of metal and/or nonmetal elements. A first portion of the oxide layer closest to the moving substrate is deposited using the first set of sputtering targets. The substrate then moves proximate the second set of sputtering targets and a second portion of the oxide layer is deposited on top of the first portion using the second set of sputtering targets. The composition of the oxide layer changes in the thickness direction through the layer.

In additional exemplary embodiments, the sputter deposition process can use targets powered by direct current (DC) power supplies in the presence of a gaseous atmosphere having inert and reactive gasses, for example argon and oxygen, respectively. The DC power supplies supply power (e.g. pulsed power) to each cathode target independent of the other power supplies. In this aspect, each individual cathode target and the corresponding material can be sputtered at differing levels of power, providing additional control of composition through the layer thickness. The pulsing aspect of the DC power supplies is similar to the frequency aspect in AC sputtering, allowing control of high rate sputtering in the presence of reactive gas species such as oxygen. Pulsing DC power supplies allow control of polarity switching, can neutralize the surface material being sputtered from the targets, and can provide uniformity and better control of the deposited material.

In one particular exemplary embodiment, improved control during sputtering can be achieved by using a mixture, or atomic composition, of elements in each target, for example a target may include a mixture of aluminum and silicon. In another embodiment, the relative proportions of the elements in each of the targets can be different, to readily provide for a varying atomic ratio throughout the oxide layer. In one embodiment, for example, a first set of dual AC sputtering targets may include a 90/10 mixture of silicon and aluminum, and a second set of dual AC sputtering targets may include a 75/25 mixture of aluminum and silicon. In this embodiment, a first portion of the oxide layer can be deposited with the 90% Si/10% Al target, and a second portion can be deposited with the 75% Al/25% Si target. The resulting oxide layer has a gradient composition that changes from about 90% Si to about 25% Si (and conversely from about 10% Al to about 75% Al) through the thickness of the oxide layer.

In typical dual AC sputtering, homogeneous oxide layers are formed, and barrier performance from these homogeneous oxide layers suffer due to defects in the layer at the micro and nano-scale. One cause of these small scale defects is inherently due to the way the oxide grows into grain boundary structures, which then propagate through the thickness of the film. Without being bound by theory, it is believed several effects contribute to the improved barrier properties of the gradient composition barriers described herein. One effect can be that greater densification of the mixed oxides occurs in the gradient region, and any paths that water vapor could take through the oxide are blocked by this densification. Another effect can be that by varying the composition of the oxide materials, grain boundary formation can be disrupted resulting in a microstructure of the film that also varies through the thickness of the oxide layer. Another effect can be that the concentration of one oxide gradually decreases as the other oxide concentration increases through the thickness, reducing the probability of forming small-scale defect sites. The reduction of defect sites can result in a coating having reduced transmission rates of water permeation.

In some exemplary embodiments, exemplary films can be subjected to post-treatments such as heat treatment, ultraviolet (UV) or vacuum UV (VUV) treatment, or plasma treatment. Heat treatment can be conducted by passing the film through an oven or directly heating the film in the coating apparatus, e.g., using infrared heaters or heating directly on a drum. Heat treatment may for example be performed at temperatures from about 30° C. to about 200° C., about 35° C. to about 150° C., or about 40° C. to about 70° C.

Other functional layers or coatings that can be added to the inorganic or hybrid film include an optional layer or layers to make the film more rigid. The uppermost layer of the film is optionally a suitable protective layer, such as optional inorganic layer 20. If desired, the protective layer can be applied using conventional coating methods such as roll coating (e.g., gravure roll coating) or spray coating (e.g., electrostatic spray coating), then cross-linked using, for example, UV radiation. The protective layer can also be formed by flash evaporation, vapor deposition and cross-linking of a monomer as described above. Volatilizable (meth)acrylate monomers are suitable for use in such a protective layer. In a specific embodiment, volatilizable (meth)acrylate monomers are employed.

Unexpected Results and Advantages

Exemplary photovoltaic devices including a barrier film of the present disclosure have a number of applications and advantages as flexible replacements for glass encapsulating materials. Thus, certain exemplary embodiments of the present disclosure provide barrier films which exhibit improved moisture resistance when used in moisture barrier applications. In some exemplary embodiments, the barrier film can be deposited directly on a substrate that includes a moisture sensitive photovoltaic device, a process often referred to as direct encapsulation.

The moisture sensitive photovoltaic device can be, for example, an organic, inorganic, or hybrid organic/inorganic photovoltaic device such as a CIGS. Flexible photovoltaic devices can be encapsulated directly with the gradient composition oxide layer. For example, the devices can be attached to a flexible carrier substrate, and a mask can be deposited to protect electrical connections from the oxide layer deposition. A base (co)polymer layer and the oxide layer can be deposited as described above, and the mask can then be removed, exposing the electrical connections.

Exemplary embodiments of the disclosed methods can enable the formation of photovoltaic devices including a composite multilayer barrier film, that exhibit superior mechanical properties such as elasticity and flexibility yet still have low oxygen or water vapor transmission rates. The films have at least one inorganic or hybrid organic/oxide layer or can have additional inorganic or hybrid organic/oxide layers. In one embodiment, the disclosed films can have inorganic or hybrid layers alternating with organic compound, e.g., (co)polymer layers. In another embodiment, the films can have a film that includes an inorganic or hybrid material and an organic compound. Substrates having a barrier film formed using the disclosed method can have an oxygen transmission rate (OTR) less than about 1 $cc/m^2$–day, less than about 0.5 $cc/m^2$–day, or less than about 0.1 $cc/m^2$–day. Substrates having a barrier film formed using the disclosed method can have an water vapor transmission rate (WVTR) less than about 10 $cc/m^2$–day, less than about 5 $cc/m^2$–day, or less than about 1 $cc/m^2$–day.

Exemplary embodiments of photovoltaic devices with barrier films according to the present disclosure are preferably transmissive to both visible and infrared light. The term "transmissive to visible and infrared light" as used herein can mean having an average transmission over the visible and infrared portion of the spectrum of at least about 75% (in some embodiments at least about 80, 85, 90, 92, 95, 97, or 98%) measured along the normal axis. In some embodiments, the visible and infrared light-transmissive assembly has an average transmission over a range of 400 nm to 1400 nm of at least about 75% (in some embodiments at least about 80, 85, 90, 92, 95, 97, or 98%). Visible and infrared light-transmissive assemblies are those that do not interfere with absorption of visible and infrared light, for example, by photovoltaic cells.

In some embodiments, the visible and infrared light-transmissive assembly has an average transmission over a range wavelengths of light that are useful to a photovoltaic cell of at least about 75% (in some embodiments at least about 80, 85, 90, 92, 95, 97, or 98%). The first and second (co)polymeric film substrates, pressure sensitive adhesive layer, and barrier film can be selected based on refractive index and thickness to enhance transmission to visible and infrared light.

Exemplary photovoltaic devices including a multilayer composite barrier film according to the present disclosure are typically flexible. The term "flexible" as used herein refers to being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the flexible assembly can be bent around a radius of curvature of at least 0.635 cm (¼ inch), 1.3 cm (½ inch) or 1.9 cm (¾ inch).

Exemplary photovoltaic devices including a multilayer composite barrier film according to the present disclosure generally do not exhibit delamination or curl that can arise from thermal stresses or shrinkage in a multilayer structure. Herein, curl is measured using a curl gauge described in "Measurement of Web Curl" by Ronald P. Swanson presented in the 2006 AWEB conference proceedings (Association of Industrial Metallizers, Coaters and Laminators, Applied Web Handling Conference Proceedings, 2006). According to this method curl can be measured to the resolution of 0.25 m$^{-1}$ curvature. In some embodiments, barrier films according to the present disclosure exhibit curls of up to 7, 6, 5, 4, or 3 m$^{-1}$. From solid mechanics, the curvature of a beam is known to be proportional to the bending moment applied to it. The magnitude of bending stress is in turn is known to be proportional to the bending moment. From these relations the curl of a sample can be used to compare the residual stress in relative terms. The properties of the barrier films disclosed herein typically are maintained even after high temperature and humidity aging.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. Furthermore, all publications, published patent applications and issued patents referenced herein are incorporated by reference in their entirety to the same extent as if each individual publication or patent was specifically and individually indicated to be incorporated by reference.

Various exemplary embodiments have been described. These and other embodiments are within the scope of the following listing of disclosed embodiments and claims.

The invention claimed is:

1. An encapsulated device comprising:
a photovoltaic cell; and
a composite film overlaying at least a portion of the photovoltaic cell, the composite film comprising:
a substrate, wherein the substrate comprises a flexible transparent (co)polymeric film;
a base (co)polymer layer on a major surface of the substrate;
an oxide layer on the base (co)polymer layer; and
a protective (co)polymer layer on the oxide layer, wherein the protective (co)polymer layer consists of the reaction product of only a (meth)acrylate monomer and at least one urea (multi)-(meth)acrylate (multi)-silane precursor compound of the formula: $R_S$—N($R^5$)—C(O)—N(H)—$R_A$, wherein:
$R_S$ is a silane containing group of the formula: —$R^1$—[Si($Y_p$)($R^2$)$_{3-p}$]$_q$, wherein:
$R^1$ is a multivalent alkylene, arylene, alkarylene, or aralkylene group, said alkylene, arylene, alkarylene, or aralkylene groups optionally containing one or more catenary oxygen atoms,
each Y is a hydrolysable group,
$R^2$ is a monovalent alkyl or aryl group;
p is 1, 2 or 3, and
q is 1-5;
$R_A$ is a (meth)acryl group containing group of the formula: $R^{11}$-(A)$_n$, wherein:
$R^{11}$ is a polyvalent alkylene, arylene, alkarylene, or aralkylene group, said alkylene, arylene, alkarylene, or aralkylene groups optionally containing one or more catenary oxygen atoms,
A is a (meth)acryl group comprising the formula: $X^2$—C(O)—C($R^3$)=$CH_2$, further wherein:
$X^2$ is —O, —S, or —$NR^3$,
$R^3$ is H, or $C_1$-$C_4$, and
n=1 to 5; and
$R^5$ is H, $C_1$ to $C_6$ alkyl, $C_3$ to $C_6$ cycloalkyl, or $R_S$, with the proviso that at least one of the following conditions applies:
n is 2 to 5, $R^5$ is $R_S$, or q is 2 to 5; and
wherein the (meth)acrylate monomer is tricyclodecane dimethanol diacrylate.

2. The encapsulated device of claim 1, wherein each hydrolysable group Y is independently selected from an alkoxy group, an acetate group, an aryloxy group, and a halogen.

3. The encapsulated device of claim 2, wherein at least some of the hydrolysable groups Y are alkoxy groups.

4. The encapsulated device of claim 2, wherein at least some of the hydrolysable groups Y are chlorine.

5. The encapsulated device of claim 1, further comprising a plurality of alternating layers of the oxide layer and the protective (co)polymer layer on the base (co)polymer layer.

6. The encapsulated device of claim 1, wherein the substrate comprises polyethylene terephthalate (PET), polyethylene napthalate (PEN), heat stabilized PET, heat stabilized PEN, polyoxymethylene, polyvinylnaphthalene, polyetheretherketone, fluoro(co)polymer, polycarbonate, polymethylmethacrylate, poly α-methyl styrene, polysulfone, polyphenylene oxide, polyetherimide, polyethersulfone, polyamideimide, polyimide, polyphthalamide, or combinations thereof.

7. The encapsulated device of claim 1, wherein the base (co)polymer layer comprises a (meth)acrylate smoothing layer.

8. The encapsulated device of claim 1, wherein the oxide layer comprises oxides, and any one or more of nitrides, carbides or borides of atomic elements from Groups IIA, IIIA, IVA, VA, VIA, VIIA, IB, or IIB, metals of Groups IIIB, IVB, or VB, rare-earth metals, or combinations thereof.

9. The encapsulated device of claim 1, further comprising an oxide layer applied to the protective (co)polymer layer, optionally wherein the oxide layer comprises silicon aluminum oxide.

* * * * *